United States Patent
Wang

(10) Patent No.: US 9,831,348 B2
(45) Date of Patent: Nov. 28, 2017

(54) THIN FILM TRANSISTOR WITH IMPROVED CARRIER MOBILTY

(71) Applicants: HannStar Display (Nanjing) Corporation, Nanjing (CN); HannStar Display Corporation, Taipei (TW)

(72) Inventor: Yung-Ching Wang, Tainan (TW)

(73) Assignees: HannStar Display (Nanjing) Corporation, Nanjing (CN); HannStar Display Corporation, Taipei (TW)

(*) Notice: Subject to any disclaimer, the term of this patent is extended or adjusted under 35 U.S.C. 154(b) by 0 days.

(21) Appl. No.: 15/044,123

(22) Filed: Feb. 16, 2016

(65) Prior Publication Data

US 2016/0240689 A1 Aug. 18, 2016

(30) Foreign Application Priority Data

Feb. 16, 2015 (CN) .......................... 2015 1 0085512

(51) Int. Cl.
- *H01L 29/786* (2006.01)
- *H01L 29/49* (2006.01)
- *H01L 29/423* (2006.01)

(52) U.S. Cl.
CPC .. *H01L 29/78669* (2013.01); *H01L 29/42384* (2013.01); *H01L 29/4908* (2013.01); *H01L 29/78603* (2013.01); *H01L 29/78633* (2013.01); *H01L 29/78666* (2013.01)

(58) Field of Classification Search
None
See application file for complete search history.

(56) References Cited

U.S. PATENT DOCUMENTS

| | | | | |
|---|---|---|---|---|
| 6,740,913 B2 * | 5/2004 | Doyle | ............... | H01L 21/26506 257/197 |
| 2002/0167007 A1 * | 11/2002 | Yamazaki | ............... | H01L 27/12 257/57 |
| 2008/0001883 A1 * | 1/2008 | Kim | .................. | G02F 1/134363 345/92 |
| 2009/0098741 A1 * | 4/2009 | Tanaka | .................... | C23C 16/34 438/791 |
| 2009/0261331 A1 * | 10/2009 | Yang | ................. | H01L 29/66765 257/57 |
| 2012/0064682 A1 * | 3/2012 | Jang | .................. | H01L 21/28273 438/268 |
| 2014/0167032 A1 * | 6/2014 | Jo | ......................... | H01L 27/124 257/43 |

* cited by examiner

*Primary Examiner* — Fazli Erdem
*Assistant Examiner* — Scott R Wilson
(74) *Attorney, Agent, or Firm* — CKC & Partners Co., Ltd.

(57) ABSTRACT

A thin film transistor is provided, and includes a gate electrode, a first gate dielectric layer, a second gate dielectric layer, a channel layer, a source electrode and a drain electrode. The gate electrode is disposed on a substrate. The first gate dielectric layer is disposed on the gate electrode and the substrate, and has a radio of the number of silicon-hydrogen bonds to the number of nitrogen-hydrogen bonds, in which the ratio is between 0.2 and 1.0. The second gate dielectric layer is disposed on the first gate dielectric layer, and has a radio of the number of silicon-hydrogen bond to the number of nitrogen-hydrogen bonds, in which the ratio is between 0.01 and 0.2. The channel layer is disposed on the second gate dielectric layer. The source electrode and drain electrode are disposed on the channel layer and located at two opposite sides of the channel layer.

10 Claims, 1 Drawing Sheet

THIN FILM TRANSISTOR WITH IMPROVED CARRIER MOBILTY

RELATED APPLICATIONS

This application claims priority to Chinese Patent Application Serial Number 201510085512.7, filed on Feb. 16, 2015, which is herein incorporated by reference.

BACKGROUND

Field of the Invention

The present invention relates to a thin film transistor (TFT), and more particularly to a TFT with high carrier mobility.

Description of Related Art

Thin film transistors (TFTs) are widely applied to flat display panels, such as liquid crystal display (LCD) panels or organic light-emitting diode (OLED) display panels. A common conventional TFT is mainly classified into three types, which are respectively an amorphous silicon (a-Si) TFT, a low temperature polysilicon (LTPS) TFT and an indium gallium zinc oxide (IGZO) TFT. These three types of TFTs have their respective characteristics. For example, the a-Si TFT has an advantage of low manufacturing cost, the LTPS TFT has an advantage of high carrier mobility, and the IGZO TFT has an advantage of the manufacturing cost and carrier mobility between the a-Si TFT and the LTPS TFT.

In general, for fabricating a large-sized display panel, the amorphous silicon TFT is often selected as the TFT in pixels of a display panel. However, the response speed of the pixels is slower because the channel mobility of the amorphous silicon TFT is low, thus resulting in an image sticking problem.

SUMMARY

The objective of the present invention is to provide a thin film transistor (TFT) which has higher carrier mobility than that of the conventional TFT. A display panel applying the TFT of the present invention is able to improve the response speed of its pixels, thereby improving an image sticking problem.

One aspect of the present invention is directed to a TFT. The TFT includes a gate electrode, a first gate dielectric layer, a second gate dielectric layer, a channel layer, a source electrode and a drain electrode. The gate electrode is disposed on a substrate. The first gate dielectric layer is disposed on the gate electrode and the substrate, where a ratio of the number of silicon-hydrogen bonds to the number of nitrogen-hydrogen bonds of the first gate dielectric layer is substantially between 0.2 and 1.0. The second gate dielectric layer is disposed on the first gate dielectric layer, where a ratio of the number of silicon-hydrogen bonds to the number of nitrogen-hydrogen bonds of the second gate dielectric layer is substantially between 0.01 and 0.2. The channel layer is disposed on the second gate dielectric layer. The source electrode and the drain electrode are disposed at two opposite sides of the channel layer, and a gap exists between the source electrode and the drain electrode.

In one embodiment of the present invention, a thickness of the second gate dielectric layer is substantially between 300 Å and 750 Å.

In one embodiment of the present invention, a sum of a thickness of the first gate dielectric layer and a thickness of the second gate dielectric layer is substantially between 2000 Å and 4000 Å.

In one embodiment of the present invention, a dielectric constant of the second gate dielectric layer is substantially between 6 and 7.

In one embodiment of the present invention, each of the first gate dielectric layer and the second gate dielectric layer respectively includes a silicon nitride layer.

Another aspect of the present invention is directed to a TFT. The TFT includes a source electrode, a drain electrode, a channel layer, a first gate dielectric layer, a second gate dielectric layer and a gate electrode. The source electrode and the drain electrode are both disposed on a substrate, and a gap exists between the source electrode and the drain electrode. The channel layer is disposed on the source electrode, the drain electrode and the substrate and covers the gap. The first gate dielectric layer is disposed on the channel layer, where a ratio of the number of silicon-hydrogen bonds to the number of nitrogen-hydrogen bonds of the first gate dielectric layer is substantially between 0.01 and 0.2. The second gate dielectric layer is disposed on the first gate dielectric layer, where a ratio of the number of silicon-hydrogen bonds to the number of nitrogen-hydrogen bonds of the second gate dielectric layer is substantially between 0.2 and 1.0. The gate electrode is disposed on the second gate dielectric layer.

In one embodiment of the present invention, a thickness of the first gate dielectric layer is substantially between 300 Å and 750 Å.

In one embodiment of the present invention, a sum of a thickness of the first gate dielectric layer and a thickness of the second gate dielectric layer is substantially between 2000 Å and 4000 Å.

In one embodiment of the present invention, a dielectric constant of the first gate dielectric layer is substantially between 6 and 7.

In one embodiment of the present invention, each of the first gate dielectric layer and the second gate dielectric layer includes a silicon nitride layer.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the present invention is described as following. The described preferred embodiments are presented for purposes of illustrations and description, and they are not intended to limit the scope of the present invention.

Figure 1:
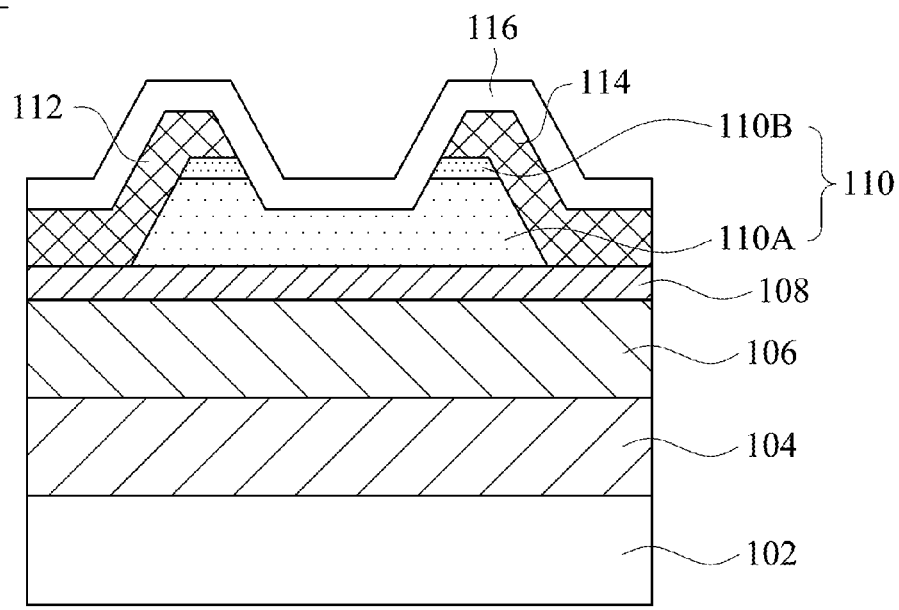
FIG. 1 is a structure diagram of a thin film transistor (TFT) in accordance with one embodiment of the invention.

Please refer to FIG. 1, FIG. 1 is a structure diagram of a thin film transistor (TFT) 100 in accordance with one embodiment of the invention. The TFT 100 is disposed on the substrate 102 which may be, but not limited to, a glass substrate, a semiconductor substrate or a plastic substrate. In this embodiment, the TFT 100 is a bottom-gate TFT, which includes a gate electrode 104, gate dielectric layers 106 and 108, a channel layer 110, a source electrode 112, a drain electrode 114 and a protective layer 116. The gate electrode 104 is disposed on the substrate 102. The material forming the gate electrode 104 may include a metal, such as chromium, wolfram, tantalum, titanium, molybdenum, aluminum, copper, or a metal alloy or compound formed from any combination of the abovementioned metals, but is not limited thereto. The gate electrode 104 may be formed through the following steps. First, a physical vapor deposition (PVD) process or other deposition process is performed to deposit a metal layer on the substrate 102, and then a part of the metal layer is remained as the gate electrode 104 through a lithographic process and an etching process, while the other part is removed by photo etching.

The gate dielectric layer 106 is disposed on the gate electrode 104 and the substrate 102 and covers the gate electrode 104. The gate dielectric layer 106 may be formed through a plasma chemical vapor deposition (PCVD) process, a plasma enhanced chemical vapor deposition (PECVD) process or other similar process for depositing a material including silicon nitride. In some embodiments, a ratio of the number of silicon-hydrogen bonds (Si—H) to the number of nitrogen-hydrogen bonds (N—H) of the gate dielectric layer 106 is between about 0.2 and about 1.0. In addition, in some embodiments, a dielectric constant of the gate dielectric layer 106 is between about 5 and about 7.

The gate dielectric layer 108 is disposed on the gate dielectric layer 106. Similarly, the gate dielectric layer 108 may be formed through a PCVD process, a PECVD process or other similar process for depositing a material including silicon nitride. In some embodiments, a ratio of the number of silicon-hydrogen bonds to the number of nitrogen-hydrogen bonds of the gate dielectric layer 108 is between about 0.01 and about 0.2. In some embodiments, a thickness of the gate dielectric layer 108 is between about 300 angstroms (Å) and about 750 angstroms. In addition, in some embodiments, a dielectric constant of the gate dielectric layer 108 is between about 6 and about 7.

According to the above description regarding to the gate dielectric layer 106 and the gate dielectric layer 108, the ratio of the number of silicon-hydrogen bonds to the number of nitrogen-hydrogen bonds of the gate dielectric layer 106 is higher than that of the gate dielectric layer 108. In addition, in some embodiments, a sum of a thickness of the gate dielectric layer 106 and a thickness of the gate dielectric layer 108 is between about 2000 angstroms and about 4000 angstroms.

The channel layer 110 is disposed on the gate dielectric layer 108 for providing a path for electron movement in the TFT 100. In this embodiment, as shown in FIG. 1, the channel layer 110 includes an amorphous silicon layer 110A and a doped amorphous silicon layer 110B. The amorphous silicon layer 110A includes hydrogenated amorphous silicon (a-Si:H), and the doped amorphous silicon layer 110B includes N-type doped hydrogenated amorphous silicon. In some embodiments, the doped amorphous silicon layer 110B includes N-type heavily doped hydrogenated amorphous silicon.

The amorphous silicon layer 110A and the doped amorphous silicon layer 110B are formed through the following steps. First, a chemical vapor deposition (CVD) process or other deposition process is performed to sequentially deposit amorphous-silicon material and doped amorphous-silicon material on the gate dielectric layer 108. Then, a lithographic process and an etching process are performed to pattern the amorphous-silicon material and the doped amorphous-silicon material deposited on the gate dielectric layer 108, so as to form the amorphous silicon layer 110A and the doped amorphous silicon layer 110B shown in FIG. 1.

The source electrode 112 and the drain electrode 114 are disposed on the channel layer 110 and the gate dielectric layer 108, locating at two opposite sides of the channel layer 110. The material forming the source electrode 112 and the drain electrode 114 may include a metal, such as chromium, wolfram, tantalum, titanium, molybdenum, aluminum, copper, or a metal alloy or compound formed from any combination of the abovementioned metals, but is not limited thereto. The source electrode 112 and the drain electrode 114 may be formed through the following processes. First, a PVD process or other deposition process is performed to deposit a metal layer on the channel layer 110 and the gate dielectric layer 108, and then a lithographic process and an etching process are performed to remove a part of the metal layer deposited on the channel layer 110. The remaining parts of the metal layer are respectively as the source electrode 112 and the drain electrode 114. A part of the amorphous silicon layer 110A and the doped amorphous silicon layer 110B are also removed during the etching process on the metal layer.

At last, the protective layer 116 is formed on the source electrode 112, the drain electrode 114 and the channel layer 110. The protective layer 116 covers the source electrode 112, the drain electrode 114 and the channel layer 110 for protecting the TFT 100, preventing the TFT 100 from being contaminated by external moisture, oxygen or impurity. The material forming the protective layer 116 may include silicon oxide, silicon nitride or silicon oxynitride, but is not limited thereto. In addition, the protective layer 116 may be a structure of single layer or multiple layers.

The characteristic of the TFT 100 is that it has two gate dielectric layers, i.e. the gate dielectric layers 106 and 108, and the ratio of the number of silicon-hydrogen bonds to the number of nitrogen-hydrogen bonds of the gate dielectric layer 106 the gate dielectric layer 108 are different. The ranges of the ratio of the number of silicon-hydrogen bonds to the number of nitrogen-hydrogen bonds, the dielectric constants and the thicknesses of the gate dielectric layers according to the aforementioned embodiments can effectively improve the carrier mobility of the TFT. Compared with the conventional TFT, the TFT of the present invention has higher carrier mobility. A display panel applying such TFT can improve the response speed of its pixels, thereby improving an image sticking problem.

Figure 2:
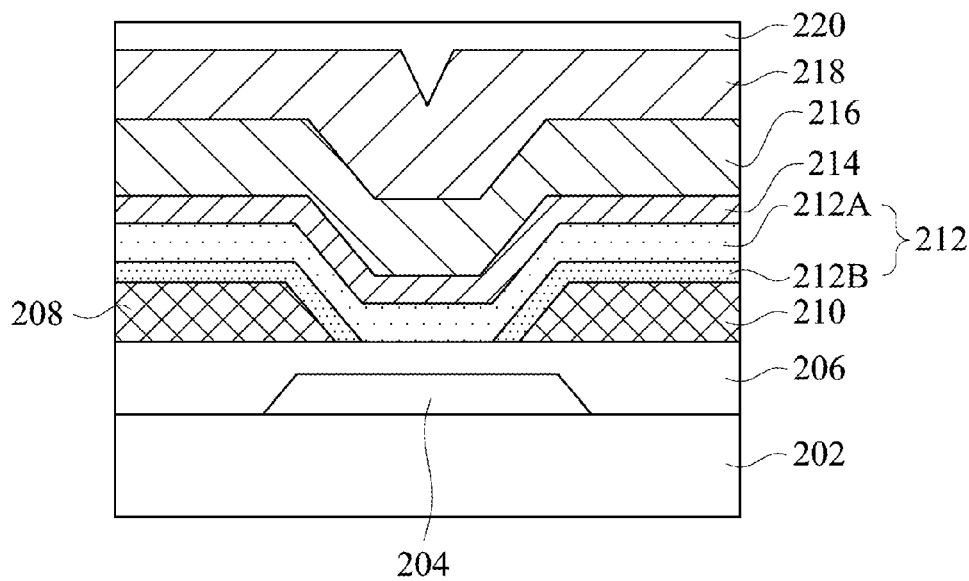
FIG. 2 is a structure diagram of a TFT in accordance with another embodiment of the invention.

The characteristics of the aforementioned embodiments may also be applied to a top-gate TFT. Please refer to FIG. 2, FIG. 2 is a structure diagram of a thin film transistor 200 in accordance with one further embodiment of the invention. The TFT 200 is disposed on the substrate 202 which may be, but not limited to, a glass substrate, a semiconductor substrate or a plastic substrate. In the embodiment, the TFT 200 is a top-gate TFT, which includes a barrier layer 204, an insulating layer 206, a source electrode 208, a drain electrode 210, a channel layer 212, gate dielectric layers 214 and 216, a gate electrode 218 and a protective layer 220. The barrier layer 204 is disposed on the substrate 202 for blocking back light from penetrating through the substrate 202 into the channel layer 212, avoiding generation of photo-induced leakage current. The barrier layer 204 includes opaque material which may be consisted of metal, semiconductor or nonmetal.

The insulating layer 206 is disposed on the barrier layer 204 and the substrate 202 and covers the barrier layer 204. The insulating layer 206 may include organic insulating material such as polyimide (PI), polyvinyl alcohol (PVA) or polymethyl methacrylate (PMMA), or inorganic insulating material such as silicon oxide or silicon nitride, but is not limited thereto. The insulating layer 206 may be formed by depositing insulating material through a CVD process or other similar deposition process.

The source electrode 208 and the drain electrode 210 are disposed on the insulating layer 206, and a gap exists between the source electrode 208 and the drain electrode 210. The material forming the source electrode 208 and the drain electrode 210 may include a metal, such as chromium, wolfram, tantalum, titanium, molybdenum, aluminum, copper, or a metal alloy or compound formed from any combination of the abovementioned metals, but is not limited thereto. The source electrode 208 and the drain electrode 210 may be formed through the following steps. First, a PVD process or other deposition process is performed to deposit a metal layer on the insulating layer 206, and then a lithographic process and an etching process are performed to remove a part of the metal layer deposited on the insulating layer 206, so as to form the source electrode 208 and the drain electrode 210 and to make a gap exist between the source electrode 208 and the drain electrode 210.

In some embodiments, the TFT 200 may by without the barrier layer 204 and the insulating layer 206, such that the source electrode 208 and the drain electrode 210 are directly formed on the substrate 202.

The channel layer 212 is disposed on the source electrode 208, the drain electrode 210 and the insulating layer 206 for providing a path for electron movement in the TFT 200. In the embodiment, as shown in FIG. 2, the channel layer 212 includes an amorphous silicon layer 212A and a doped amorphous silicon layer 212B. The amorphous silicon layer 212A includes N-type doped hydrogenated amorphous silicon, and the doped amorphous silicon layer 212B includes hydrogenated amorphous silicon. In some embodiments, the doped amorphous silicon layer 212B includes N-type heavily doped hydrogenated amorphous silicon.

The doped amorphous silicon layer 212B and the amorphous silicon layer 212A are sequentially formed on the source electrode 208, the drain electrode 210 and the insulating layer 206 through a CVD process or other deposition process, such that the doped amorphous silicon layer 212B covers the source electrode 208 and the drain electrode 210 and the amorphous silicon layer 212A covers the doped amorphous silicon layer 212B and the gap between the source electrode 208 and the drain electrode 210.

The gate dielectric layer 214 is disposed on and covers the channel layer 212. the gate dielectric layer 214 may be formed through a PCVD process, a PECVD process or other similar process for depositing a material including silicon nitride. In some embodiments, a ratio of the number of silicon-hydrogen bonds to the number of nitrogen-hydrogen bonds of the gate dielectric layer 214 is between about 0.01 and about 0.2. In some embodiments, a thickness of the gate dielectric layer 214 is between about 300 angstroms and about 750 angstroms. In addition, in some embodiments, a dielectric constant of the gate dielectric layer 214 is between about 6 and about 7.

The gate dielectric layer 216 is disposed on and covers the gate dielectric layer 214. The gate dielectric layer 216 may be formed through a PCVD process, a PECVD process or other similar process for depositing a material including silicon nitride. In some embodiments, a ratio of the number of silicon-hydrogen bonds to the number of nitrogen-hydrogen bonds of the gate dielectric layer 216 is between about 0.2 and about 1.0. In addition, in some embodiments, a dielectric constant of the gate dielectric layer 216 is between about 5 and about 7.

In the embodiments of the TFT 200, the ratio of the number of silicon-hydrogen bonds to the number of nitrogen-hydrogen bonds of the gate dielectric layer 216 is higher than that of the gate dielectric layer 214. In addition, in some embodiments, a sum of a thickness of the gate dielectric layer 214 and a thickness of the gate dielectric layer 216 is between about 2000 angstroms and about 4000 angstroms.

The gate electrode 218 is disposed on the gate dielectric layer 216. The material forming the gate electrode 218 may include a metal, such as chromium, wolfram, tantalum, titanium, molybdenum, aluminum, copper, or a metal alloy or compound formed from any combination of the abovementioned metals, but is not limited thereto.

The protective layer 220 is disposed on the gate electrode 218 and covers the gate electrode 218 for protecting the TFT 200, preventing the TFT 200 from being contaminated by external moisture, oxygen or impurity. The material forming the protective layer 220 may include silicon oxide, silicon nitride or silicon oxynitride, but is not limited thereto. In addition, the protective layer 220 may be a structure of single layer or multiple layers.

Summing the above, the TFT of the present invention has two gate dielectric layers, and the ranges of the ratio of the number of silicon-hydrogen bonds to the number of nitrogen-hydrogen bonds, the dielectric constants and the thicknesses of the gate dielectric layers according to present invention can effectively improve the carrier mobility of the TFT. A display panel applying the TFT of the present invention can improve the response speed of its pixels, thereby improving an image sticking problem.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:
1. A thin film transistor (TFT), comprising:
a gate electrode disposed on a substrate;
a first gate dielectric layer disposed on the gate electrode and the substrate and directly contacting the gate electrode, wherein a ratio of a number of silicon-hydrogen bonds to a number of nitrogen-hydrogen bonds of the first gate dielectric layer is substantially between 0.2 and 1.0;
a second gate dielectric layer disposed on the first gate dielectric layer, wherein a ratio of the number of silicon-hydrogen bonds to the number of nitrogen-hydrogen bonds of the second gate dielectric layer is substantially between 0.01 and 0.2;
a channel layer disposed on and directly contacting the second gate dielectric layer; and
a source electrode and a drain electrode, wherein the source electrode and the drain electrode are disposed at two opposite sides of the channel layer, and a gap exists between the source electrode and the drain electrode.
2. The TFT of claim 1, wherein a thickness of the second gate dielectric layer is substantially between 300 Å and 750 Å.
3. The TFT of claim 1, wherein a sum of a thickness of the first gate dielectric layer and a thickness of the second gate dielectric layer is substantially between 2000 Å and 4000 Å.

4. The TFT of claim 1, wherein a dielectric constant of the second gate dielectric layer is substantially between 6 and 7.

5. The TFT of claim 1, wherein each of the first gate dielectric layer and the second gate dielectric layer comprises a silicon nitride layer.

6. A thin film transistor (TFT), comprising:
- a source electrode and a drain electrode both disposed on a substrate, wherein a gap exists between the source electrode and the drain electrode;
- a channel layer disposed on the source electrode, the drain electrode and the substrate, the channel layer covering the gap;
- a first gate dielectric layer disposed on and directly contacting the channel layer, wherein a ratio of a number of silicon-hydrogen bonds to a number of nitrogen-hydrogen bonds of the first gate dielectric layer is substantially between 0.01 and 0.2;
- a second gate dielectric layer disposed on the first gate dielectric layer, wherein a ratio of the number of silicon-hydrogen bonds to the number of nitrogen-hydrogen bonds of the second gate dielectric layer is substantially between 0.2 and 1.0; and
- a gate electrode disposed on and directly contacting the second gate dielectric layer.

7. The TFT of claim 6, wherein a thickness of the first gate dielectric layer is substantially between 300 Å and 750 Å.

8. The TFT of claim 6, wherein a sum of a thickness of the first gate dielectric layer and a thickness of the second gate dielectric layer is substantially between 2000 Å and 4000 Å.

9. The TFT of claim 6, wherein a dielectric constant of the first gate dielectric layer is substantially between 6 and 7.

10. The TFT of claim 6, wherein each of the first gate dielectric layer and the second gate dielectric layer comprises a silicon nitride layer.

* * * * *